(12) United States Patent
Morehouse et al.

(10) Patent No.: US 11,137,789 B2
(45) Date of Patent: *Oct. 5, 2021

(54) FRACTIONAL TURN COIL WINDING

(71) Applicant: THE REGENTS OF THE UNIVERSITY OF CALIFORNIA, Oakland, CA (US)

(72) Inventors: Mark Morehouse, Costa Mesa, CA (US); Eusebio Garate, Irvine, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 16/511,638

(22) Filed: Jul. 15, 2019

(65) Prior Publication Data

US 2020/0159274 A1 May 21, 2020

Related U.S. Application Data

(63) Continuation of application No. 14/823,974, filed on Aug. 11, 2015, now Pat. No. 10,394,270, which is a
(Continued)

(51) Int. Cl.
*H01F 5/00* (2006.01)
*G05F 5/00* (2006.01)
(Continued)

(52) U.S. Cl.
CPC ............... *G05F 5/00* (2013.01); *H01F 5/00* (2013.01); *H01F 5/04* (2013.01); *H03H 1/00* (2013.01); *H02M 3/07* (2013.01)

(58) Field of Classification Search
CPC .... H01F 5/00; H01F 5/04; H03H 1/00; G05F 5/00; H02M 3/07
(Continued)

(56) References Cited

U.S. PATENT DOCUMENTS 6,348,848 B1    2/2002  Herbert
7,257,816 B2    8/2007  Kulp et al.
(Continued)

FOREIGN PATENT DOCUMENTS

GB    641494 A     8/1950
GB    2344930 A    6/2000
(Continued)

OTHER PUBLICATIONS

IN, 2967/KOLNP/2015 Examination Report, dated Aug. 7, 2019.
(Continued)

*Primary Examiner* — Adolf D Berhane
(74) *Attorney, Agent, or Firm* — One LLP (57) ABSTRACT

Systems and methods for multiplying the loop voltage of a coil having one or more turns using multiple coil sections to multiply the loop voltage by a factor equal to the number of coil arc sections. The systems and methods for producing fractional turn windings comprise splitting the initial feed line from the capacitor by as many times as the desired total multiple of the voltage in the capacitor, and applying the feeds to the respective fractional turns or arc sections of the coil.

23 Claims, 4 Drawing Sheets

Related U.S. Application Data continuation of application No. PCT/US2014/015883, filed on Feb. 11, 2014.

(60) Provisional application No. 61/763,281, filed on Feb. 11, 2013.

(51) Int. Cl.
    *H03H 1/00*     (2006.01)
    *H01F 5/04*     (2006.01)
    *H02M 3/07*     (2006.01)

(58) Field of Classification Search
USPC .......... 336/365, 83, 182, 200, 206–208, 232
See application file for complete search history.

(56) References Cited

U.S. PATENT DOCUMENTS

| | | | |
|---|---|---|---|
| 7,302,462 B2 | 11/2007 | Kulp et al. | |
| 9,117,634 B2 | 8/2015 | Jang | |
| 9,642,238 B2 | 5/2017 | Lee | |
| 10,394,270 B2 * | 8/2019 | Morehouse | H01F 5/00 |
| 2002/0007794 A1 | 1/2002 | Byun et al. | |
| 2004/0040939 A1 | 3/2004 | Oh | |
| 2010/0066251 A1 | 3/2010 | Nakagami et al. | |
| 2012/0062203 A1 | 3/2012 | Kim | |
| 2012/0247679 A1 | 10/2012 | Yamazawa | |

FOREIGN PATENT DOCUMENTS

| | | |
|---|---|---|
| JP | 2008-136311 | 6/2008 |
| WO | WO 00/69231 A1 | 11/2000 |
| WO | WO 2013/018268 A1 | 2/2013 |

OTHER PUBLICATIONS

JP, 20155-57209 Final Official Action, dated Jan. 15, 2019.
JP, 20155-57209 Denial of Entry of Amendment, Jan. 15, 2019.
JP, 2015-557209 Official Action, dated Feb. 26, 2018.
WO, PCT/US2014/015883 ISR and Written Opinion, dated Feb. 9, 2015.
Dike, R.S. et al., "The Development of an Interleaved, Fractional-Turn Coil", LA-3234, UC-37, Instruments, TID-4500, 43 Ed., Los Alamos Scientific Laboratory of the University of California, 1965, pp. 1-8.
JP, 2015-557209 Office Action, dated Jul. 29, 2020.

* cited by examiner

FRACTIONAL TURN COIL WINDING

CROSS-REFERENCE TO RELATED APPLICATIONS

The present application is a continuation of U.S. patent application Ser. No. 14/823,974, filed Aug. 11, 2015, which is a continuation of PCT Patent Appl. No. PCT/US14/15883, filed Feb. 11, 2014, which claims the benefit of and priority to U.S. Provisional Application No. 61/763,281, filed on Feb. 11, 2013, all of which are incorporated herein by reference in their entireties for all purposes.

FIELD

The embodiments described herein relate generally to loop voltage of coils and, more particularly, to systems and methods that elevate the loop voltage of single turn and multi-turn coils to a greater volt per turn value than the power source or switch to which coil is coupled could produce or accommodate.

BACKGROUND INFORMATION

A multitude of applications require a single turn coil. However, it is sometimes desirable to increase the voltage provided by a capacitor or other power source to a single turn coil to increase the loop voltage of the single turn coil. The need to increase the voltage provided is typically due to the voltage rating of the capacitor or an associated switch being less than needed for the application. Increasing the voltage rating of the capacitor or the switch is often a cost prohibitive solution.

One current solution is to provide a greater volt per turn to a single turn coil than the capacitor could produce or the switch could accommodate using opposite polarity voltages. However, the opposite polarity technique is limited to increasing the loop voltage of the single turn coil to only double the voltage the capacitor can produce.

Thus, it is desirable to provide systems and methods that facilitate increasing the loop voltage of a coil to any desired multiple of the voltage stored in the capacitor or other power source.

SUMMARY

The embodiments described herein are directed to use of fractional turn windings to produce a desired multiple of a voltage stored in a capacitor, a capacitor bank, or other power source to which the coil is connected as the loop voltage around the turns of a coil. More particularly, the embodiments described herein are directed to systems and methods for multiplying the loop voltage of a single turn coil or a multi-turn coil using multiple coil sections to multiply the loop voltage by a factor equal to the number of coil arc sections.

The systems and methods for producing fractional turn windings comprise splitting the initial feed line from the capacitor by as many times as the desired total multiple of the voltage in the capacitor, and applying the feeds to the respective fractional turns or arc sections of the coil. For example, to double the loop voltage, one would split the capacitor feed line into two feeds and apply them to connections 180 degrees apart. Where the feed line is a coaxial cable, the center conductor of each coaxial feed returns to the shield of the coaxial feed of the adjacent turn or arc section of the coil. Accordingly the voltage can be increased by as many times as the coil can be practically divided.

The system and methods provided herein, which are directed to an inductively coupled system, are fully utilizable in any AC circuit system.

Other systems, methods, features and advantages of the example embodiments will be or will become apparent to one with skill in the art upon examination of the following figures and detailed description.

BRIEF DESCRIPTION OF THE FIGURES

The details of the example embodiments, including structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

It should be noted that elements of similar structures or functions are generally represented by like reference numerals for illustrative purpose throughout the figures. It should also be noted that the figures are only intended to facilitate the description of the preferred embodiments.

DETAILED DESCRIPTION

Each of the additional features and teachings disclosed below can be utilized separately or in conjunction with other features and teachings to produce systems and methods that facilitate increasing the loop voltage of single and multi-turn coils to any desired multiple of the voltage stored in a capacitor, a capacitor bank, or other power source to which the coil is connected. Representative examples of the present invention, which examples utilize many of these additional features and teachings both separately and in combination, will now be described in further detail with reference to the attached drawings. This detailed description is merely intended to teach a person of skill in the art further details for practicing preferred aspects of the present teachings and is not intended to limit the scope of the invention. Therefore, combinations of features and steps disclosed in the following detailed description may not be necessary to practice the invention in the broadest sense, and are instead taught merely to particularly describe representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

The embodiments described herein are directed to multiplying the loop voltage of a full effective single turn coil using multiple coil sections to multiply the loop voltage by a factor equal to the number of coil arc sections. Other embodiments described herein are directed to multiplying the loop voltage of multi-turn coils using multiple coil sections to multiply the loop voltage by a factor equal to the number of coil arc sections.

Figure 1:
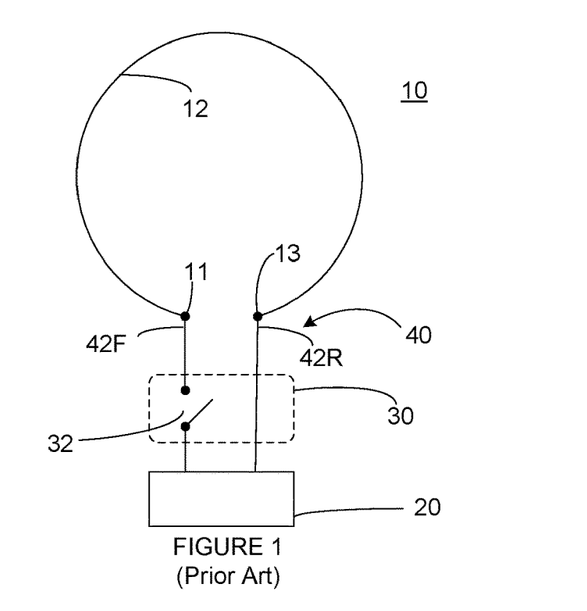
FIG. 1 is a schematic of a conventional circuit with a capacitor or capacitor bank coupled through a switch to a load comprising a single turn coil.

Turning to FIG. 1, a conventional circuit 10 having a load comprising a single turn coil 12 is depicted. A single turn coil, such as the single turn coil depicted in FIG. 1, can be used for a multitude of applications.

As depicted in FIG. 1, the single turn coil 12 includes an input end 11 and output end 13 and is coupled to a capacitor or bank of capacitors 20 through a switch 30 preferably having ratings capable of delivering the charge or voltage stored in the capacitor 20 into the load, i.e., the single turn coil 12. A transmission line 40, such as, e.g., a coaxial cable, strip line or the like, includes a feed component 42F coupled to the input 11 of the coil 12 and a return component 42R coupled to the output 13 of the coil 12.

In operation, a two-position or two-state switch mechanism 32 is closed to transmit the voltage stored in the capacitor 20 to the coil 12. As noted above, the loop voltage of the single turn coil 12 is limited to the voltage rating of the capacitor 20 or the switch 30.

The embodiments described herein are directed to use of fractional turn windings to produce a desired multiple of a voltage stored in a capacitor, a capacitor bank, or other power source to which the coil is connected as the loop voltage around single or multi-turn coils. The systems and methods for producing fractional turn windings comprise splitting the initial feed line from the capacitor by as many times as the desired total multiple of the voltage in the capacitor, and applying the feeds to the respective fractional turns or arc sections of the coil. For example, to double the loop voltage, one would split the capacitor feed line into two feeds and apply them to connections 180 degrees apart. Where the feed line is a coaxial cable, the center conductor of each coaxial feed returns to the shield of the coaxial feed of the adjacent turn or arc section of the single turn coil. Accordingly the voltage can be increased by as many times as the turn coil can be practically divided. In principle, a larger coil can be divided more often. As such, the maximum number of divisions is related to the finite size of the connections and minimum breakdown lengths between positive and negative coil terminations.

It is also noted that the power transmitted to the single turn coil is advantageously increased as a greater current is drawn from the capacitor or capacitor bank as the circuit inductance and transmission line resistance are both lowered.

Figure 2:
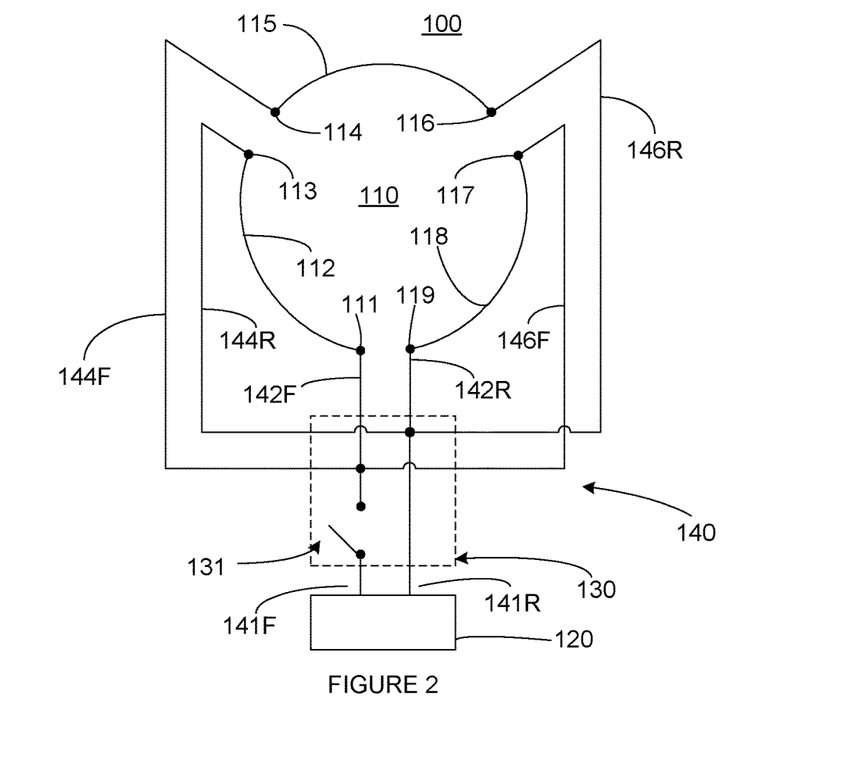
FIG. 2 is a schematic of a circuit with a capacitor or capacitor bank coupled through a switch to a load comprising a single turn coil having N arc sections that produce a loop voltage in the single turn coil N times the stored voltage in the capacitor or capacitor bank.

Turning to FIG. 2, a preferred embodiment of a circuit 100 having a load comprising a single turn coil 110 that includes fractional turn windings 112, 115 and 118 is shown. Although depicted as having three electrically distinct fractional turn windings segments or arc sections 112, 115 and 118 for exemplary purposes only, a single turn coil with fractional turn windings preferable will have two or more electrically distinct arc sections where the single turn coil can be divided into as many arc sections that are practical. As depicted, the arc sections are azimuthally symmetric but could be azimuthally asymmetric, i.e., have different arc lengths.

The single turn coil 110 is coupled through a switch 130 to a capacitor, a bank of capacitors or other power source 120 (capacitor). The switch 130 preferably comprises a single two-position or two-state switch mechanism 131. The switch 130 used to energize the coil can have drastically lower voltage requirements, but must have higher current carrying capability if only one switch mechanism 131 is used as depicted in FIG. 2. The move towards solid state switches provides for a greater current capability for a given voltage.

As further depicted in FIG. 2, the transmission feed line 140 from the capacitor 120 is divided into three feeds 142F, 144F and 146F coupled to the inputs 111, 114 and 117 of the three arc sections 112, 115 and 118, respectively. The return current of each feed 142F, 144F and 146F, whether coaxial or strip line, flows on the return path for the feed of another arc section, preferably the next arc section, and in the case of a coaxial feed, the current of each coaxial feed flows on the shield for the coaxial feed of another arc section. For example, the return 144R of the feed 144F for the second arc section 115 is coupled to the output 113 of the first arc section 112 and, thus, the return current of the feed 142F for the first arc section 112 flows on the return 144R of the feed 144F for the second arc section 115. Likewise, the return 146R of the feed 146F for the third arc section 118 is coupled to the output 116 of the second arc section 115 and, thus, the return current of the feed 144F for the second arc section 115 flows on the return 146R of the feed 146F for the third arc section 118. Further likewise, the return 142R of the feed 142F for the first arc section 112 is coupled to the output 119 of the third arc section 118 and, thus, the return current of the feed 146F for the third arc section 118 flows on the return 142R of the feed 142F for the first arc section 112.

Figure 3:
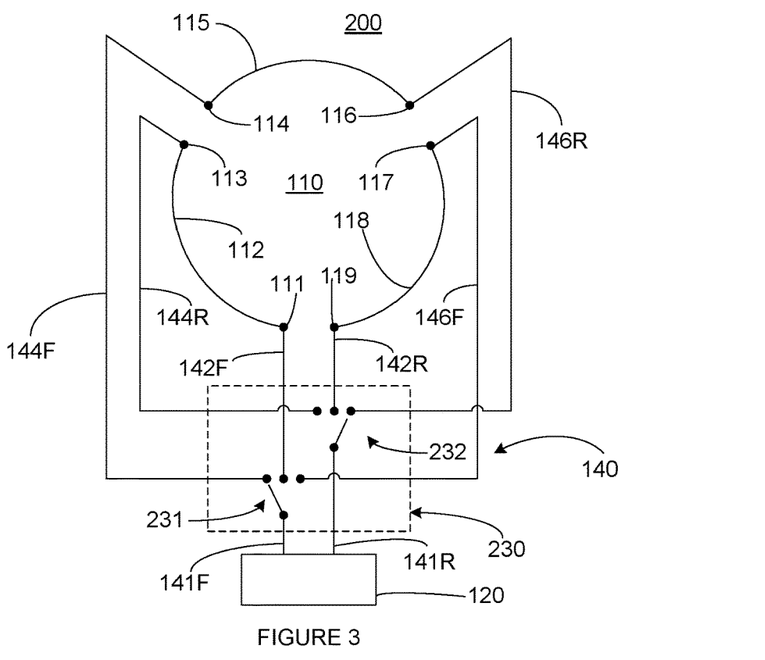
FIG. 3 is a schematic of a circuit with a capacitor or capacitor bank coupled through a switch having one or more three-position switch mechanisms to a load comprising a single turn coil having N arc sections that produce a loop voltage in the single turn coil N times the stored voltage in the capacitor or capacitor bank.

As shown in FIG. 3, an alternate embodiment of a circuit 200 includes a switch 230 that preferably comprises two (2) three-position switch mechanisms 231 and 232 operably coupling the split feeds 142F, 144F and 146F and split returns 142R, 144R and 146R to the feed 141F and return 141R of the transmission feed line 140 coming from the capacitor 120.

Figure 4:
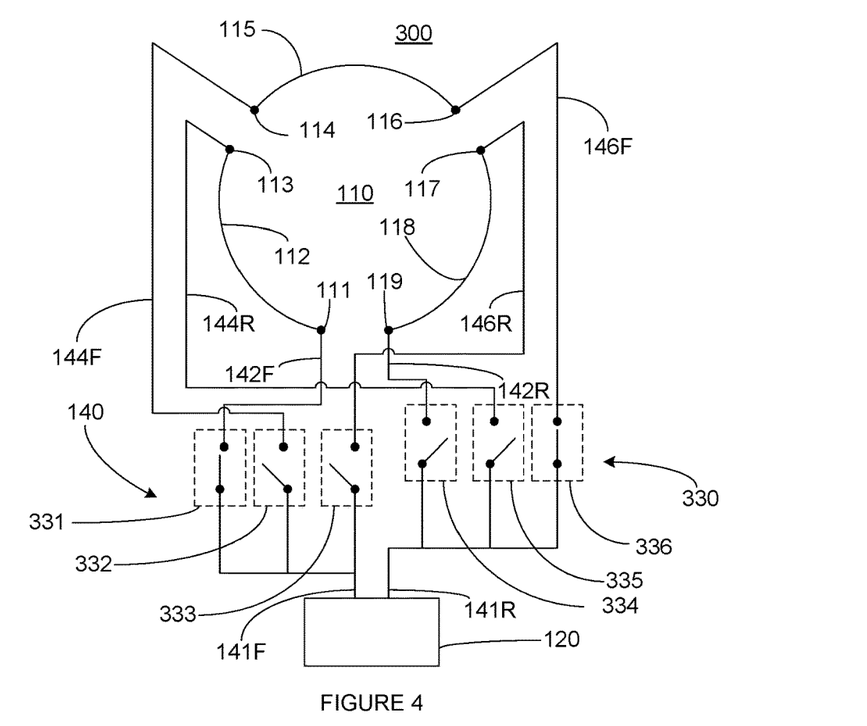
FIG. 4 is a schematic of a circuit with a capacitor or capacitor bank coupled through multiple switches to a load comprising a single turn coil having N arc sections that produce a loop voltage in the single turn coil N times the stored voltage in the capacitor or capacitor bank.

However, each feed can also be controlled by a separate switch as depicted in yet another alternate embodiment of a circuit 300 shown in FIG. 4, thereby reducing the current requirements on each individual switch, while retaining the lowered voltage requirement enabled by the disclosed design. As shown in FIG. 4, a switch 330 preferably comprises separate switches 331, 332, 333, 334, 335 and 336 coupling the split feeds 142F, 144F and 146F and split returns 142R, 144R and 146R, respectively, to the feed 141F and return 141R of the transmission feed line 140 coming from the capacitor 120.

In the case of multiple switches, however, timing jitter and synchronization between switches would need to be adequately controlled. However, those skilled in the art will readily recognize that many satisfactory designs can be devised to meet this constraint.

Advantageously, the load inductance is reduced as a percentage of the total coil arc sections. The stray inductance of the multiple feeds also reduces with the increased number of feeds as all such feeds are seen by the circuit as being in parallel. Similarly, the load inductances are also seen as being in parallel. The relation of the closed loop voltage and inductance to the number M of coil turns and the number N of arc sections is provide in Table 1 below.

TABLE 1

| Coil Turns | M = 1 | M > 1 | M < 1 |
|---|---|---|---|
| Arc Sections | N | N | N |
| Closed Loop Voltage | V · N | (V · N)/M | Not Closed |
| Inductance | L/N | (L · M)/N | (L · M)/N |

Figure 5:
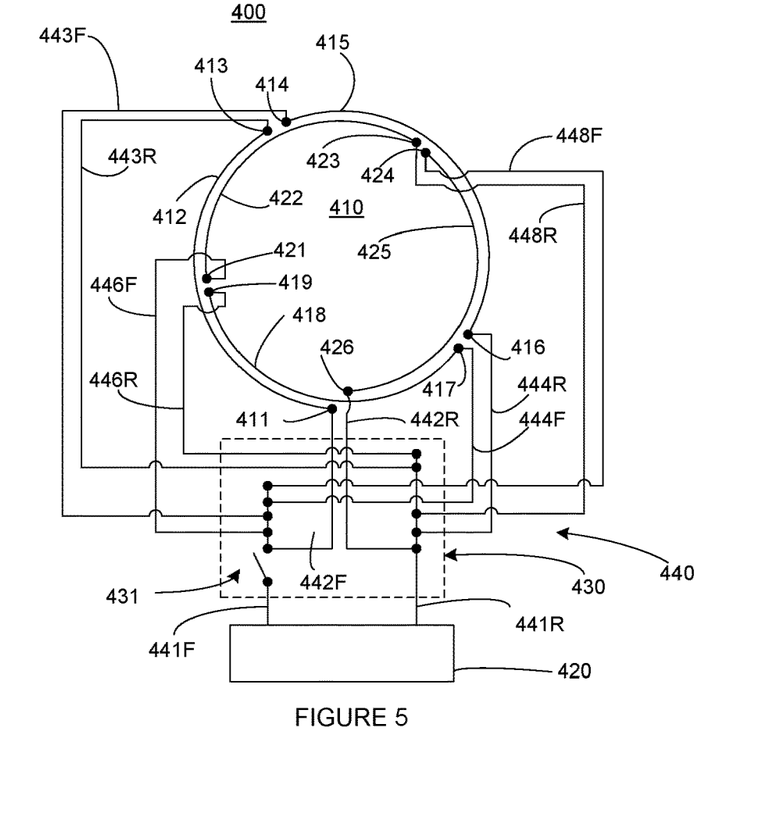
FIG. 5 is a schematic of a circuit with a capacitor or capacitor bank coupled through a switch to a load comprising a multi-turn coil, where M=2, and having N arc sections that produce a loop voltage in the multi-turn coil N/M times the stored voltage in the capacitor or capacitor bank.

Turning to FIG. 5, an alternate embodiment of a circuit 400 is shown having a load comprising a multi turn coil 410, where M=2, and fractional turn windings 412, 415, 418, 422 and 425. Although depicted as having five electrically distinct fractional turn windings segments or arc sections 412, 415, 418, 422 and 425 for exemplary purposes only, a multi turn coil with fractional turn windings preferable will have two or more electrically distinct arc sections where the multi turn coil can be divided into as many arc sections that are practical. As depicted, the arc sections are azimuthally symmetric but could be azimuthally asymmetric, i.e., have different arc lengths.

The multi turn coil 410 is coupled through a switch 430 to a capacitor, a bank of capacitors or other power source 420 (capacitor). The switch 430 preferably comprises a single two-position or two-state switch mechanism 431. The switch 430 used to energize the coil can have drastically lower voltage requirements, but must have higher current carrying capability if only one switch mechanism 431, such as a solid state switch as noted above with regard to FIG. 2.

As depicted, the transmission feed line 440 from the capacitor 420 is divided into five feeds 442F, 443F, 444F, 446F and 448F coupled to the inputs 411, 414, 417, 421, 424 of the five arc sections 412, 415, 418, 422, and 425 respectively. The return current of each feed 442F, 443F, 444F, 446F and 448F, whether coaxial or strip line, flows on the return paths 442R, 443R, 444R, 446R and 448R for the feed of another arc section, preferably the next arc section, and in the case of a coaxial feed, the current of each coaxial feed flows on the shield for the coaxial feed of another arc section. For example, the return 443R of the feed 443F for the second arc section 415 is coupled to the output 413 of the first arc section 412 and, thus, the return current of the feed 442F for the first arc section 412 flows on the return 443R of the feed 443F for the second arc section 415. Likewise, the return 444R of the feed 444F for the third arc section 418 is coupled to the output 416 of the second arc section 415 and, thus, the return current of the feed 443F for the second arc section 415 flows on the return 444R of the feed 444F for the third arc section 418. Further likewise, the return 446R of the feed 446F for the fourth arc section 422 is coupled to the output 419 of the third arc section 418 and, thus, the return current of the feed 444F for the third arc section 418 flows on the return 446R of the feed 446F for the fourth arc section 422. Also further likewise, the return 448R of the feed 448F for the fifth arc section 425 is coupled to the output 423 of the fourth arc section 422 and, thus, the return current of the feed 446F for the fourth arc section 422 flows on the return 448R of the feed 448F for the fifth arc section 422. Yet further likewise, the return 442R of the feed 442F for the first arc section 412 is coupled to the output 426 of the fifth arc section 425 and, thus, the return current of the feed 448F for the fifth arc section 425 flows on the return 442R of the feed 442F for the first arc section 412.

As noted from Table 1, the closed loop voltage CLV is defined as $$CLV = (V \cdot N)/M$$

For the coil 410 of the circuit 400 depicted in FIG. 5, where N=5 arc sections, and M=2 turns, CLV=5V/2 or 2.5 V.

Figure 6:
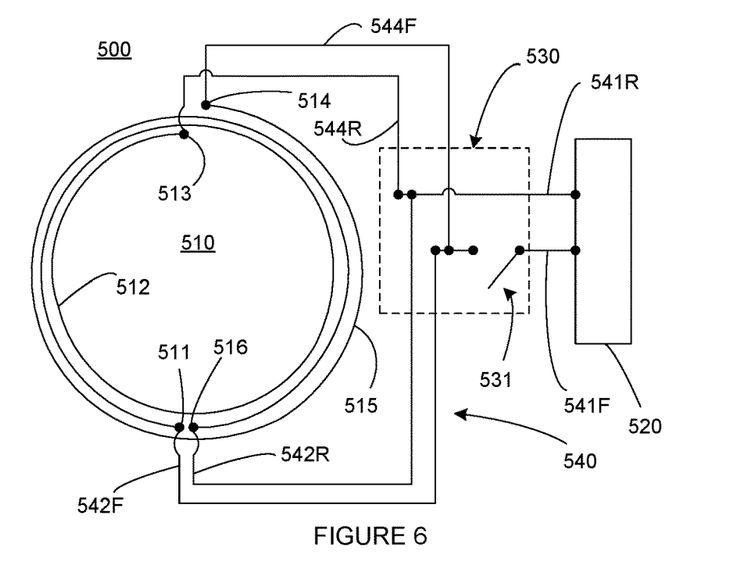
FIG. 6 is a schematic of a circuit with a capacitor or capacitor bank coupled through a switch to a load comprising a multi-turn coil, where M=3, and having N arc sections that produce a loop voltage in the multi-turn coil N/M times the stored voltage in the capacitor or capacitor bank.

Another alternate embodiment of a circuit 500 is depicted in FIG. 6 as having a load comprising a multi turn coil 510 having three turns (M=3) and includes two fractional turn windings (N=2) 512 and 515 is shown. Although depicted as having two electrically distinct fractional turn windings segments or arc sections 512 and 515 for exemplary purposes only, a multi turn coil having 3 or more turns (M≥3) with fractional turn windings preferable will have four or more electrically distinct arc sections (N≥4) where the multi turn coil can be divided into as many arc sections that are practical. As depicted, the arc sections are azimuthally symmetric but could be azimuthally asymmetric, i.e., have different arc lengths.

The multi turn coil 510 is coupled through a switch 530 to a capacitor, a bank of capacitors or other power source 520 (capacitor). The switch 530 preferably comprises a single two-position or two-state switch mechanism 531. As depicted, the transmission feed line 540 from the capacitor 520 is divided into two feeds 542F and 544F coupled to the inputs 511 and 514 of the two arc sections 512 and 515 respectively. The return current of each feed 542F and 544F, whether coaxial or strip line, flows on the return paths 542R and 544R for the feed of other arc section, and in the case of a coaxial feed, the current of each coaxial feed flows on the shield for the coaxial feed of another arc section. For example, the return 544R of the feed 544F for the second arc section 515 is coupled to the output 513 of the first arc section 512 and, thus, the return current of the feed 542F for the first arc section 512 flows on the return 544R of the feed 544F for the second arc section 515. Likewise, the return 542R of the feed 542F for the first arc section 512 is coupled to the output 516 of the second arc section 515 and, thus, the return current of the feed 544F for the second arc section 515 flows on the return 542R of the feed 542F for the first arc section 512.

Figure 7:
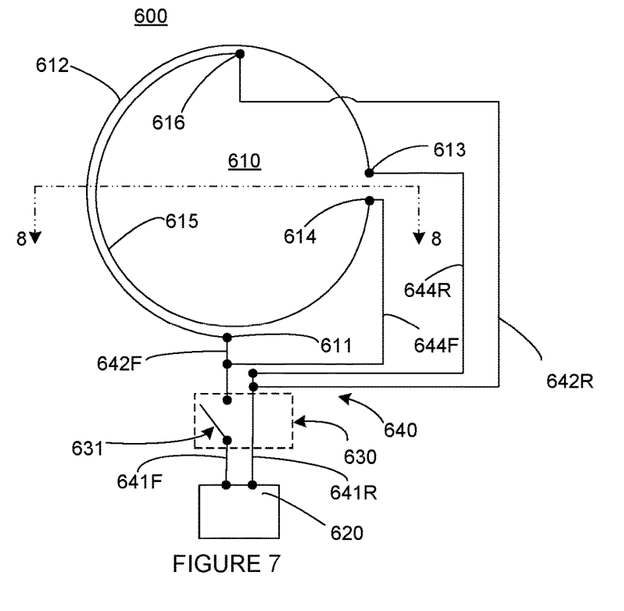
FIG. 7 is a schematic of a circuit with a capacitor or capacitor bank coupled through a switch to a load comprising a multi-turn coil, where M=1.5, and having N arc sections that produce a loop voltage in the multi-turn coil N/M times the stored voltage in the capacitor or capacitor bank.

Turning to FIG. 7, another alternate embodiment of a circuit 600 is depicted as having a load comprising a multi turn coil 610 having more than a single turn where a turn beyond the single turn does not include a full turn, i.e., the number M of coil turns is a non-integer. Like the embodiments noted above, the coil 610 includes fractional turn windings 612 and 615. Although depicted as having two electrically distinct fractional turn windings segments or arc sections 612 and 615 for exemplary purposes only, the multi turn coil can be divided into as many arc sections that are practical. As depicted, the arc sections are azimuthally symmetric but could be azimuthally asymmetric, i.e., have different arc lengths.

The multi turn coil 610 is coupled through a switch 630 to a capacitor, a bank of capacitors or other power source 620 (capacitor). The switch 630 preferably comprises a single two-position or two-state switch mechanism 631. As depicted, the transmission feed line 640 from the capacitor 620 is divided into two feeds 642F and 644F coupled to the inputs 611 and 614 of the two arc sections 612 and 615 respectively. The return current of each feed 642F and 644F, whether coaxial or strip line, flows on the return paths 642R and 644R for the feed of other arc section, and in the case of a coaxial feed, the current of each coaxial feed flows on the shield for the coaxial feed of another arc section. For example, the return 644R of the feed 644F for the second arc section 615 is coupled to the output 613 of the first arc section 612 and, thus, the return current of the feed 642F for the first arc section 612 flows on the return 644R of the feed 644F for the second arc section 615. Likewise, the return 642R of the feed 642F for the first arc section 612 is coupled to the output 616 of the second arc section 615 and, thus, the return current of the feed 644F for the second arc section 615 flows on the return 642R of the feed 642F for the first arc section 612.

As noted from Table 1, the closed loop voltage CLV is defined as

CLV=(V·N)/M

For the circuit 610 depicted in FIG. 7, where N=2 arc sections, and M=1.5 turns, CLV=2V/1.5 or 1.33 V.

Figure 8:
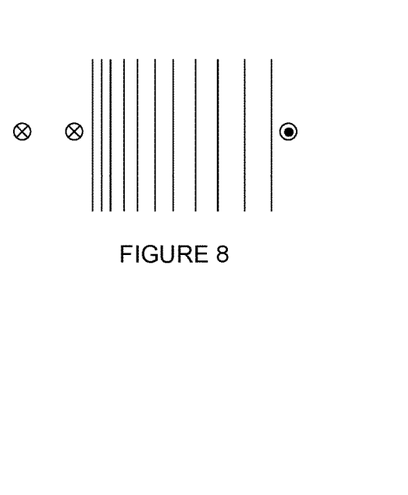
FIG. 8 is a schematic cross-sectional view of the circuit in FIG. 7 taken along 8-8 and showing a magnetic field gradient.

As shown in FIG. 8, the magnetic field for a coil have multiple turns where M is a non-integer will not be uniform but rather having a gradient as depicted.

Figure 9:
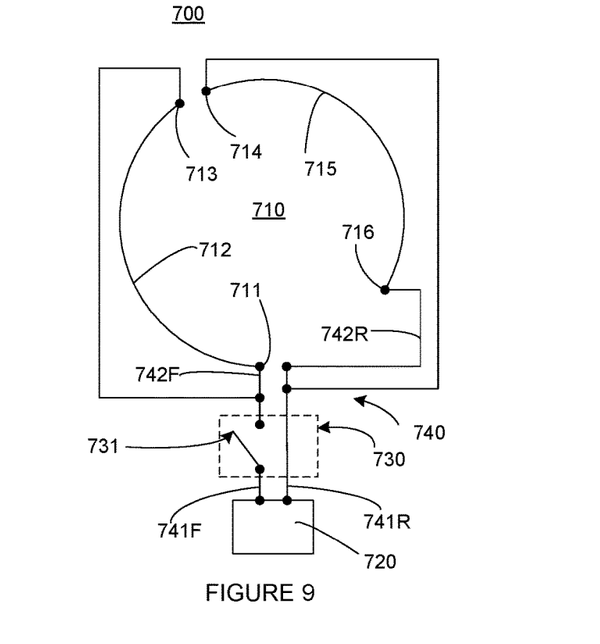
FIG. 9 is a schematic of a circuit with a capacitor or capacitor bank coupled through a switch to a load comprising a fractional-turn coil, where M<1, and having N arc sections.

Turning to FIG. 9, a circuit 700 is depicted as having a load comprising a partial turn coil 710 having less than one full turn, i.e., the number of turns M<1. Like the embodiments noted above, the coil 710 includes fractional turn windings 712 and 715. Although depicted as having two electrically distinct fractional turn windings segments or arc sections 712 and 715 for exemplary purposes only, the coil 710 can be divided into as many arc sections that are practical. As depicted, the arc sections are azimuthally symmetric but could be azimuthally asymmetric, i.e., have different arc lengths.

The partial turn coil 710 is coupled through a switch 730 to a capacitor, a bank of capacitors or other power source 720 (capacitor). The switch 730 preferably comprises a single two-position or two-state switch mechanism 731. As depicted, the transmission feed line 740 from the capacitor 720 is divided into two feeds 742F and 744F coupled to the inputs 711 and 714 of the two arc sections 712 and 715 respectively. The return current of each feed 742F and 744F, whether coaxial or strip line, flows on the return paths 742R and 744R for the feed of other arc section, and in the case of a coaxial feed, the current of each coaxial feed flows on the shield for the coaxial feed of another arc section. For example, the return 744R of the feed 744F for the second arc section 715 is coupled to the output 713 of the first arc section 712 and, thus, the return current of the feed 742F for the first arc section 712 flows on the return 744R of the feed 744F for the second arc section 715. Likewise, the return 742R of the feed 742F for the first arc section 712 is coupled to the output 716 of the second arc section 715 and, thus, the return current of the feed 744F for the second arc section 715 flows on the return 742R of the feed 742F for the first arc section 712.

Similar the coil 610 of the circuit 600 depicted in FIG. 7, the magnetic field of the partial turn coil 710 is not uniform but rather having a gradient.

The systems and methods discussed above advantageously allow the use of lower voltage switches or lower voltage capacitors to produce a greater volt per turn to a coil than the capacitor itself could otherwise produce, without the requirement to use opposite polarity voltages, which is only capable of doubling the voltage. However, the opposite polarity technique can also be used with the split coil embodiments described herein, thereby further increasing the loop voltage of the coil.

The magnetic field energy available from the capacitor (or capacitor bank) is not increased. It is delivered on a shorter time scale (assuming stray inductances to be substantially less than the load inductance).

The example embodiments provided herein, however, are merely intended as illustrative examples and not to be limiting in any way.

All features, elements, components, functions, and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and steps from different embodiments, or that substitute features, elements, components, functions, and steps from one embodiment with those of another, even if the following description does not explicitly state, in a particular instance, that such combinations or substitutions are possible. Express recitation of every possible combination and substitution is overly burdensome, especially given that the permissibility of each and every such combination and substitution will be readily recognized by those of ordinary skill in the art upon reading this description.

In many instances, entities are described herein as being coupled to other entities. It should be understood that the terms "coupled" and "connected" (or any of their forms) are used interchangeably herein and, in both cases, are generic to the direct coupling of two entities (without any non-negligible (e.g., parasitic) intervening entities) and the indirect coupling of two entities (with one or more non-negligible intervening entities). Where entities are shown as being directly coupled together, or described as coupled together without description of any intervening entity, it should be understood that those entities can be indirectly coupled together as well unless the context clearly dictates otherwise.

While the embodiments are susceptible to various modifications and alternative forms, specific examples thereof have been shown in the drawings and are herein described in detail. It should be understood, however, that these embodiments are not to be limited to the particular form disclosed, but to the contrary, these embodiments are to cover all modifications, equivalents, and alternatives falling within the spirit of the disclosure. Furthermore, any features, functions, steps, or elements of the embodiments may be recited in or added to the claims, as well as negative limitations that define the inventive scope of the claims by features, functions, steps, or elements that are not within that scope.

What is claimed is:

1. A voltage multiplying circuit comprising:
an individual power source having a voltage V; and
a load coupled through a switch to the individual power source, the load comprising a single turn coil having a number N of coil arc sections that divide the single turn coil into electrically discreet arc segments, wherein the N coil arc sections are coupled in parallel to the individual power source, wherein a sum of the N coil arc sections equals a single turn and a loop voltage of the load equals the voltage V multiplied by the number N of coil arc sections.

2. The circuit of claim 1, wherein the power source comprising one of a capacitor and a capacitor bank comprising a plurality of capacitors.

3. The circuit of claim 1, wherein an inductance of the load is reduced as a function of the number N of coil arc sections as compared to a load comprising an undivided single turn coil.

4. The circuit of claim 1, further comprising T split transmission feed lines coupled through the switch to a feed of the individual power source and T split transmission return lines coupled through the switch to a return of the power source, wherein T equals the number N of coil arc sections.

5. The circuit of claim 4, wherein the T split transmission feed and return lines comprise T coaxial cables.

6. The circuit of claim 5, wherein a center conductor on one of the T split transmission feed lines has a current return path in common with one of the other T split transmission feed lines coupled through the switch to the feed of the individual power source.

7. The circuit of claim 1, wherein the switch having a voltage rating capable of delivering the voltage V from the individual power source into the load.

8. The circuit of claim 1, wherein an applied voltage of the individual power source is of single polarity.

9. The circuit of claim 1, wherein an applied voltage of the individual power source is of opposite polarity.

10. A voltage multiplying circuit comprising:
an individual power source having a voltage V; and
a load coupled through a switch to the individual power source, the load comprising a coil having a number M of coils turns, and having a number N of coil arc sections that divide the coil into electrically discreet arc segments, wherein the N coil arc sections are coupled in parallel to the switch, wherein a sum of the N coil arc sections equals the M coil turns and a voltage of the load equals the voltage V multiplied by the number N of coil arc sections and divided by the number M of coil turns.

11. The circuit of claim 10, wherein the number M of coil turns is an integer.

12. The circuit of claim 11, wherein the integer is equal to or greater than 2.

13. The circuit of claim 10, wherein the number M of coil turns is a non-integer.

14. The circuit of claim 13, wherein the non-integer is less than 1.

15. The circuit of claim 10, wherein the power source comprising one of a capacitor and a capacitor bank comprising a plurality of capacitors coupled in parallel to the switch.

16. The circuit of claim 10, wherein an inductance of the load is reduced as a function of the number N of coil arc sections as compared to a load comprising an undivided coil.

17. The circuit of claim 10, further comprising T split transmission feed lines coupled through the switch to a feed of the individual power source and T split transmission return lines coupled through the switch to a return of the power source, wherein T equals the number N of coil arc sections.

18. The circuit of claim 17, wherein the T split transmission feed and return lines comprise T coaxial cables.

19. The circuit of claim 18, wherein a center conductor on one of the T split transmission feed lines has a current return path in common with one of the other T split transmission feed lines coupled through the switch to the feed of the individual power source.

20. The circuit of claim 10, wherein the switch having a voltage rating capable of delivering the voltage V from the individual power source into the load.

21. The circuit of claim 10, wherein an applied voltage of the individual power source is of single polarity.

22. The circuit of claim 10, wherein an applied voltage of the individual power source is of opposite polarity.

23. The circuit of claim 16, wherein the inductance of the load is increased as a function of the number M of coil turns.

* * * * *